United States Patent [19]

White, Jr. et al.

[11] 4,247,919

[45] Jan. 27, 1981

[54] LOW POWER QUASI-STATIC STORAGE CELL

[75] Inventors: Lionel S. White, Jr.; Ngai H. Hong, both of Houston, Tex.

[73] Assignee: Texas Instruments Incorporated, Dallas, Tex.

[21] Appl. No.: 48,964

[22] Filed: Jun. 15, 1979

[51] Int. Cl.³ .................. G11C 7/00; G11C 11/40
[52] U.S. Cl. ................................ 365/222; 365/187
[58] Field of Search ............. 365/222, 187, 188

[56] References Cited

U.S. PATENT DOCUMENTS

| 4,070,653 | 1/1978 | Rao et al. | 365/222 |
| 4,161,791 | 7/1979 | Leach | 365/222 |

OTHER PUBLICATIONS

Shiga et al., "A Monostable CMOS RAM with Self-Refresh Mode, 1976 IEEE International Solid-State Circuits Conf., pp. 134–135, 2/19/76.

*Primary Examiner*—Stuart N. Hecker
*Attorney, Agent, or Firm*—John G. Graham

[57] ABSTRACT

A semiconductor memory device forming a static type memory cell uses three field effect transistors. One is connected between a storage node and a bit line so it functions as an access transistor. The storage node is connected to a refresh node through a second transistor having its gate shorted to drain, and the third transistor connects the refresh node to a supply voltage. A voltage dependent capacitor connects the refresh node to a refresh clock. A logic 1 on the storage node turns on the third transistor and charges the refresh node, which turns on the capacitor so the refresh clock is coupled through to turn on the second transistor and refresh the storage node. When a logic 0 is stored, this will not happen.

8 Claims, 5 Drawing Figures

LOW POWER QUASI-STATIC STORAGE CELL

BACKGROUND OF THE INVENTION

This invention relates to semiconductor memory devices, and more particularly to a quasi-static read-/write memory cell.

Semiconductor memory devices manufactured at the present time are for the most part of two types, static or dyamic. Static cells usually consist of bistable flip-flop circuits having six transistors, four transistors and two resistors as shown in U.S. Pat. No. 4,110,776, issued to G. R. Mohan Rao et al, assigned to Texas Instruments. Dyanamic cells are usually of the one-transistor type shown in pending application Ser. No. 648,594, filed Jan. 12, 1976, by C-K. Kuo, assigned to Texas Instruments. The static cells use too much power because one side of each latch is always conductive, and also require excessive space on the chip. The dyanmic cells are smaller and use little power, but the stored voltage leaks off the capacitor so periodic refresh is needed. The refresh operation uses part of the system operating time and also requires address counters and other circuitry to generate the refresh address and the like.

It is the principal object of this invention to provide an improved semiconductor memory cell. Another object is to provide a static type memory cell which does not have to be periodically addressed for refresh. A further object is to provide a memory cell which uses less power than static latch type cells and is smaller in size.

SUMMARY OF THE INVENTION

In accordance with one embodiment of the invention, a semiconductor memory device forming a static type memory cell uses three field effect transistors. One is connected between a storage node and a bit line so it functions as an access transistor. The storage node is connected to a refresh node through a second transistor having its gate shorted to drain, and the third transistor connects the refresh node to a supply voltage. A voltage dependent capacitor connects the refresh node to a refresh clock. A logic 1 on the storage node turns on the third transistor and charges the refresh node, which turns on the capacitor so the refresh clock is coupled through to turn on the second transistor and refresh the storage node. When a logic 0 is stored, this will not happen.

BRIEF DESCRIPTION OF THE DRAWINGS

The novel features believed characterisitic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
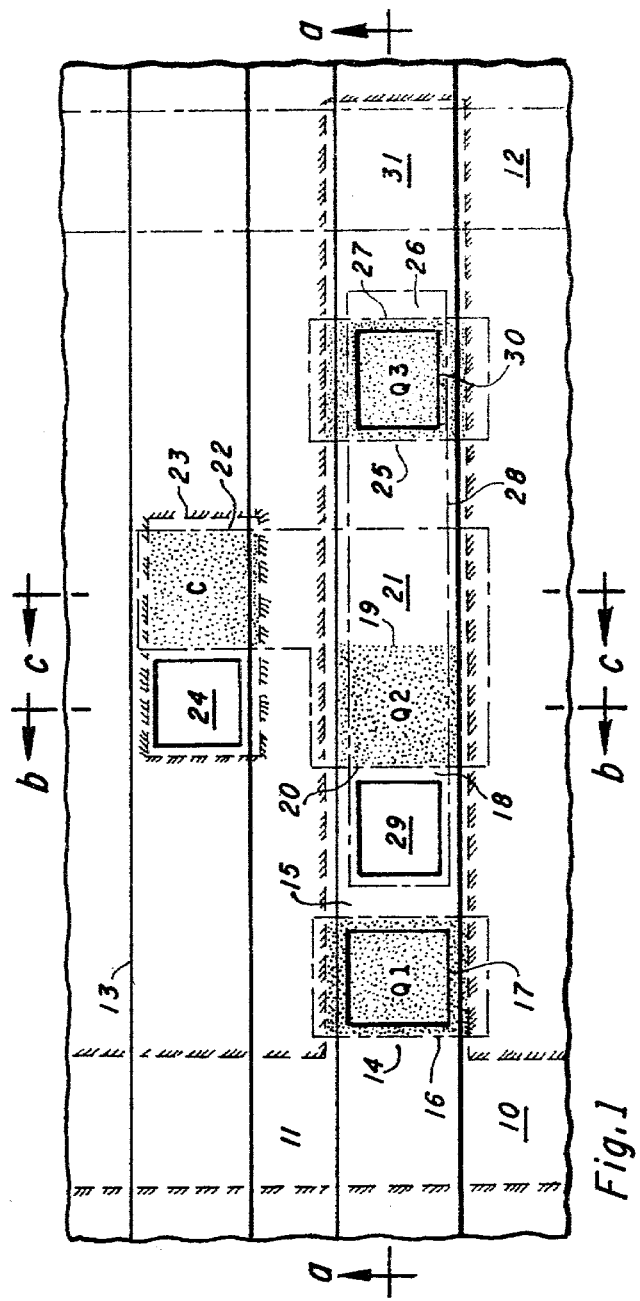
FIG. 1 is a greatly enlarged plan view of a small portion of a semiconductor chip showing the physical layout of a quasi-static RAM cell having the features of the invention.
Figure 2:
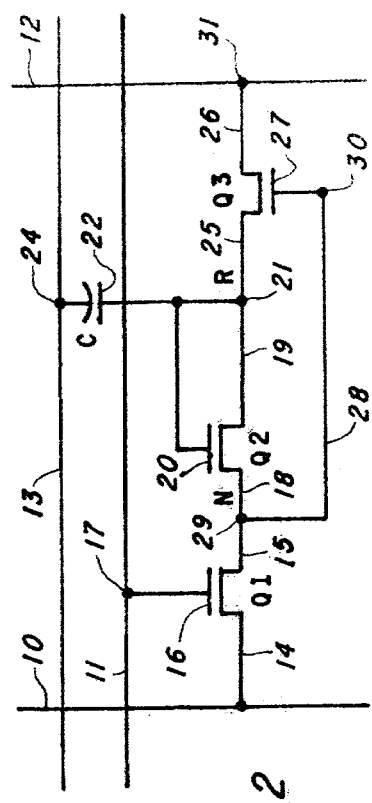
FIG. 2 is an electrical schematic diagram of the cell of FIG. 1.
Figure 3A:
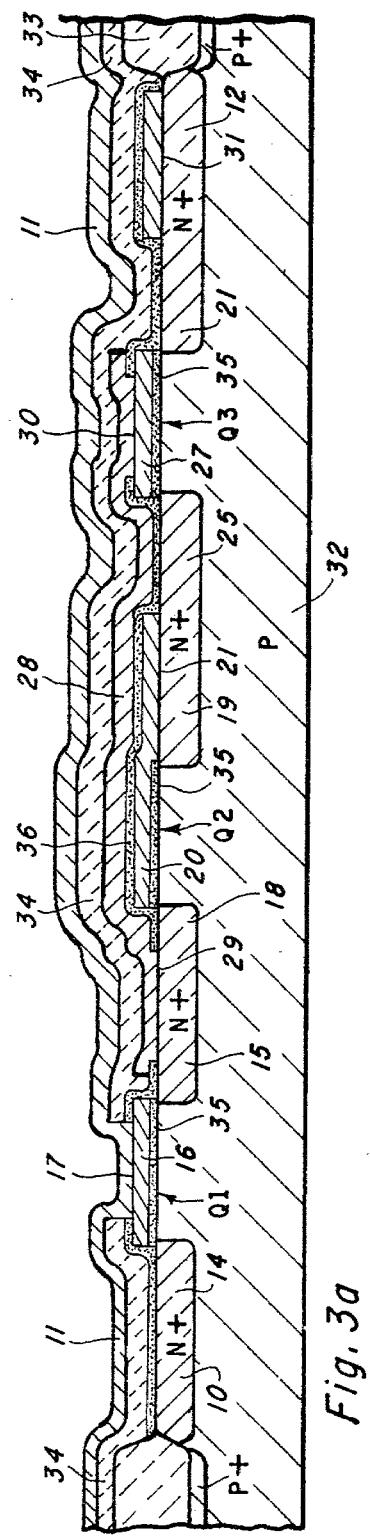
FIGS. 3a-3c are elevation views in section of the cell of FIG. 1, taken along the lines a—a, b—b and c—c, respectively.
Figure 3C:
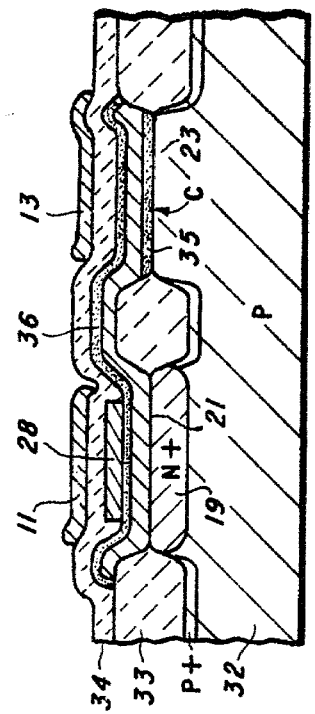
Figure 3B:
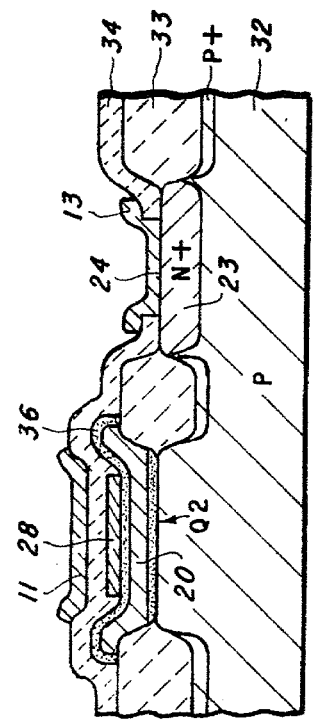

In FIGS. 1, 2 and 3, a static memory cell according to the invention is illustrated. The cell includes three transistors Q1, Q2 and Q3 and a capacitor C, along with a bit line or Y address line 10, a word line or X address line 11, a Vdd supply line 12, and a refresh clock supply line 13. The refresh clock has a period of about five microseconds. The access transistor Q1 includes N+ source and drain regions 14 and 15; a polysilicon gate 16 is connected to the X address line 11 at a metal-to-poly contact 17. The transistor Q2 includes N+ source and drain regions 18 and 19, and a gate 20 which is connected to the drain 19 at a poly-to-silicon contact 21 and further connected to an upper plate 22 of the capacitor C. The lower plate of the capacitor is part of a moat region 23 which is connected to the clock line 13 at a metal-to-moat contact 24. The transistor Q3 has N+ source and drain regions 25 and 26, and a gate 27 which is connected to the source 18 of the transistor Q2 by a second level polysilicon strip 28 with a second-poly-to-moat contact 29 and a second-poly-to-first-poly contact 30. The drain 26 of the transistor Q3 is connected to the Vdd supply line 12 at a poly-to-moat contact 31.

In the cell shown, a bit of data is stored on the capacitance of node N at the source of the transistor Q2. This node includes the gate 27 of the transistor Q3. The bit may be either a logic 1 at +5v which tends to turn on the transistor Q3, or a logic 0 at 0v which tends to turn off the transistor Q3. During a time when the refresh clock is low, if a logic 1 level is stored on the node N the transistor Q3 is on and the node R will charge from Vdd, thus charging the plate 22 of the capacitor C. This inverts the silicon under the plate 22 in the moat 23 so the capacitance will be high. So, when the refresh clock goes high, charge will be pumped through the transistor Q2, restoring the charge on the node N.

In a write operation the refresh clock is low. In writing a logic 0, the node N is discharged through the transistor Q1 into the bit line 10, and at the same time the node R, if charged, is discharged through transistors Q2 and Q1. When a logic 0 is stored on the node N, the node R will not be charged through the transistor Q2, so when the refresh clock goes to logic 1 no charge will be transferred to the node R as the capacitance of the capacitor C will be virtually zero. The leakage associated with the node N continues to discharge this node, preventing it from rising unless it is written into via the transistor Q1.

In writing in a logic 1, with the refresh clock low and the address line 11 high, the transistor Q1 is on and a logic 1 voltage on the bit line 10 will charge the node N to (Vdd-Vt). This turns on the transistor Q3, and the node R charges to (Vdd-2Vt), insufficient to turn on the transistor Q2. Then after the address line 11 goes low, the node N stays charged and is refreshed as described above.

Reading of the data stored may be by a differential sense amplifier of the type used in MOS dynamic RAMs. A bistable sense amplifier in the center of a bit line 10, with an equal number of cells on each side, functions to detect whether a 1 or 0 is stored on a node N, and also to restore the bit stored on the node N of the addressed cell, so the read operation is non-destructive. A dummy cell would be used on the opposite side of the sense amplifier to establish a differential voltage to be amplified. Refresh does not require operation of the sense amplifier, except during read.

For optimum operation, the transistor Q2 should have a lower Vt than the capacitor C. Thus, when a logic 0 is written into the cell the node N will be discharged below the threshold voltage of the capacitor C, ensuring that no charge can be pumped from the node R to the node N. The easiest way to accomplish this is to make the channel width of the transistor Q2 wider than the width of the capacitor C. This assumes that the devices are on the order of 0.3 mil wide. In this size range the Vt is a strong function of the channel width.

The cell described usually would be part of an array of perhaps 16,384 like cells, all formed in a single chip of monocrystalline silicon of less than one-fourth inch on a side. In this example, there would be 128 of the bit lines 10 and 128 of the X address lines 11. The cell layout seen in FIG. 1 would be mirrored about the line 10 to form the cell on the left and about the line 12 to form the cell on the right. In addition, the refresh clock line 13 and the contact 24 would be shared with the cell above the one shown.

The cell is formed in a bar 32 of monocrystalline silicon, only a very small part of which is shown. Thick field oxide 33 surrounds the moats containing the transistors and other active areas. Interlevel oxide 34 separates the polysilicon gates and strips from the metal strips 11 and 13. Thin gate oxide 35 functions as the gate insulator for the transistors and as the dielectric of the capacitor C. An oxide coating 36 separates the first level poly from the second level polysilicon.

Although the invention has been described with reference to specific embodiments, this description is not meant to be construed in a limiting sense. Various modifications of the disclosed embodiments as well as other embodiments of the invention, will become apparent to persons skilled in the art upon reference to the description of the invention. It is therefore contemplated that the appended claims will cover any such modifications or embodiments as fall within the true scope of the invention.

What is claimed:

1. A static memory cell comprising first, second and third transistors each having a source-to-drain path and a gate, a source of logic voltages, a storage node, a refresh node, a voltage-dependent capacitor, a source of clock voltage, means connnecting the source of logic voltages to the storage node via the source-to-drain path of the first transistor, means connecting the storage node to the gate of the third transistor, means connecting the gate of the second transistor to the refresh node, the storage node being connected to the refresh node via the source-to-drain path of the second transistor, the source of clock voltage being connected to the refresh node via said capacitor, and a supply voltage connected to the refresh node via the source-to-drain path of the third transistor.

2. A device according to claim 1 wherein the capacitor includes an upper plate in the form of a polysilicon layer connected to the refresh node and a lower plate in the form of a silicon region separated from the upper plate by a thin dielectric.

3. A device according to claim 2 wherein the second transistor has a lower threshold voltage than the capacitor.

4. A memory device comprising first and second control devices each having a current path and a control electrode, a storage node, a refresh node, a voltage-dependent capacitor, a refresh clock source, the current path of the first control device connecting the storage node to the refresh node, means connecting the storage node to the control electrode of the second control device, means connecting the control electrode of the first control device to the refresh node, the refresh clock source being connected to the refresh node via said capacitor, a voltage source connected to the refresh node via the current path of the second transistor, and means for selectively coupling logic voltage to the storage node and for detecting the voltage on the storage node.

5. A device according to claim 4 wherein the control devices are insulated gate field effect transistors.

6. A device according to claim 5 wherein the capacitor is an MOS capacitor.

7. A device according to claim 6 wherein the first control device has a threshold voltage less than that of the capacitor.

8. A device according to claim 7 wherein the refresh clock is a periodic voltage of about the same magnitude as the voltage source.

* * * * *